United States Patent [19]
Pak

[11] Patent Number: 5,229,640
[45] Date of Patent: Jul. 20, 1993

[54] SURFACE MOUNTABLE CLOCK OSCILLATOR MODULE

[75] Inventor: Hoklay Pak, El Paso, Tex.

[73] Assignee: AVX Corporation, New York, N.Y.

[21] Appl. No.: 938,764

[22] Filed: Sep. 1, 1992

[51] Int. Cl.⁵ .................. H01L 23/12; H01L 23/48
[52] U.S. Cl. ................. 257/666; 257/723; 257/724
[58] Field of Search ............ 257/666, 723, 724, 735, 257/777, 778, 725; 331/77

[56] References Cited

U.S. PATENT DOCUMENTS

| | | | |
|---|---|---|---|
| 3,784,725 | 1/1974 | Perkins et al. | 257/724 |
| 4,780,795 | 10/1988 | Meinel | 257/703 |
| 4,916,413 | 4/1990 | Nakayama et al. | 331/68 |
| 5,038,119 | 8/1991 | Tsuchido | 331/158 |

FOREIGN PATENT DOCUMENTS

| | | |
|---|---|---|
| 62-18803 | 1/1987 | Japan . |
| 62-38604 | 2/1987 | Japan . |
| 62-39907 | 2/1987 | Japan . |
| 62-61406 | 3/1987 | Japan . |
| 2055232A | 2/1981 | United Kingdom . |

OTHER PUBLICATIONS

Brochure: Epson, "the Crystalmaster '91", including cover sheet and pp. 19 and 20.

*Primary Examiner*—Rolf Hille
*Assistant Examiner*—S. V. Clark
*Attorney, Agent, or Firm*—Spensley Horn Jubas & Lubitz

[57] ABSTRACT

A crystal controlled clock oscillator resin encapsulated in a surface mount device (SMD) package incorporates on a lead frame a crystal oscillator, an integrated circuit, a power supply filter capacitor and, optionally, a feedback resistor. In the fabrication of the device, resin is injected at a position and in a direction relative to the components so as to minimize disturbance of the lead frame and the components mounted thereon.

2 Claims, 4 Drawing Sheets

SURFACE MOUNTABLE CLOCK OSCILLATOR MODULE

FIELD OF THE INVENTION

The present invention relates generally to resin encapsulated clock oscillator modules and particularly to a compact, surface mountable clock oscillator module which incorporates within the resin encapsulation a crystal oscillator, an integrated circuit, a power supply filter capacitor and, optionally, a resistor. The invention also relates to a method for the high yield production of such modules.

BACKGROUND OF THE INVENTION

Clock oscillators are devices which control the timing and operation of logic circuitry. The use of such devices is extremely widespread in consumer and industrial electronic products. A personal computer system, for example, may use several clock oscillators in the main processing unit as well as on add-in circuit boards and video graphics adapters, and in all of the peripheral devices such as printers, modems and networking equipment. In the telecommunication industry, clock oscillators are used in facsimile machines, cellular phones and radio transmission and receiver systems.

Clock oscillator devices are presently made by combining in a single package a frequency control device, such as a quartz crystal, and a hybrid circuit of resistors, capacitors and either transistors or an integrated circuit. The components are mounted on a thick film substrate or printed circuit board with the package being protected from the environment by a hermetically sealed metal can which also serves to reduce noise, that is, the unwanted electromagnetic and radio frequency emissions which oscillators often generate. These existing packages conform to DIP (dual in-line pin) standards and typically employ 8 or 14 pins.

With the continuing need for further miniaturization of electronic components, attempts have been made to produce more compact clock oscillator packages. Such units, however, continue to conform to DIP package standards and often do not incorporate passive components such as power supply filter capacitors. These components must therefore be added separately external to the clock oscillator package. Examples of such units are disclosed in U.S. Pat. No. 4,916,413 issued Apr. 10, 1990 to Nakayama et al.

Another drawback of existing resin-encapsulated clock oscillator devices is that as a result of the positions and orientations of the components on the lead frame relative to the placement and orientation of the resin injection gate, the transfer molding operation used to resin encapsulate the components tends to disturb the components and lead traces of the lead frame sometimes to the extent that delicate bonded connections are broken. Moreover, because of the rapid hardening rate of the epoxy resin that is typically employed, the resin does not always fill the entire cavity thereby often compromising the mechanical integrity of the unit and eventually exposing the encapsulated components and their connections to ambient environmental effects.

SUMMARY OF THE INVENTION

The aforementioned problems and drawbacks of existing clock oscillator packages are overcome by the present invention. In accordance with one aspect of the invention there is provided a compact, surface mountable clock oscillator module including a lead frame having end edges or margins, side edges or margins perpendicular to the end margins and a pair of J-lead pins projecting from each of the side margins. The lead frame further defines an integrated circuit die pad, a pair of chip capacitor pads, a pair of crystal oscillator pads, conductors interconnecting said pins and pads, and an opening for receiving a crystal oscillator. The crystal oscillator pads are positioned proximate one of the end margins of the lead frame and the integrated circuit die pad and chip capacitor pads are positioned between the crystal oscillator opening and one of the side margins of the lead frame. A generally cylindrical crystal oscillator is disposed within the lead frame opening, the crystal oscillator having end surfaces and a central longitudinal axis extending generally parallel with the side margins of the lead frame. The crystal oscillator further includes a pair of leads extending from one of the end surfaces of the crystal oscillator and connected to the crystal oscillator pads defined by the lead frame. An integrated circuit is mounted on the integrated circuit die pad and includes terminals connected to selected lead frame conductors and a chip capacitor is mounted on the chip capacitor pads. All of the aforementioned elements except for the J-lead pins are contained within a unitary resin encapsulation. Optionally, a resistor connected in parallel with the crystal oscillator can also be incorporated within the package. Where such resistor is included, it is mounted along the same side of the crystal oscillator as the IC and capacitor.

In the present invention, the crystal oscillator and other components are thus placed so that a filter chip capacitor and, optionally, a chip resistor, can be incorporated within a compact module conforming to surface mount device (SMD) standard package sizes.

In accordance with another aspect of the present invention there is provided a method of making a compact, surface mountable clock oscillator module as described above. In accordance with one preferred embodiment of the method, there is provided a flat sheet strip having longitudinally extending, perforated side bars, the strip defining a plurality of lead frames spaced longitudinally along the strip, each lead frame being configured as described above. The crystal oscillator, IC, capacitor and, optionally, the resistor mentioned above, are attached to their associated pads on the lead frame with the IC, capacitor and resistor being disposed between the crystal oscillator and one of the side margins of the lead frame. All of the aforementioned circuit elements are then resin-encapsulated by means of a transfer molding operation to form individual clock oscillator modules along the strip, the resin being injected through a transversely extending gate positioned along the other of said side margins and adjacent said one of the end margins. The individual clock oscillator modules are then separated from the strip and the lead pins of each lead frame are formed into standard J-lead configurations.

By injecting resin adjacent the aforedescribed corner of the lead frame, that is, in a manner in which the resin is injected in a direction that is perpendicular to and intercepts the longitudinally extending fixed leads of the crystal oscillator and on the side of the lead frame opposite the side supporting the active and passive components, disturbance of the lead frame, the components and their interconnections is minimized during the injection process. It has also been found that as a result of the described resin injection gate position and injection direction, each mold cavity is completely filled. Superior yields are thereby obtained.

BRIEF DESCRIPTION OF THE DRAWINGS

Further objects, advantages and features of the present invention will become evident from a reading of the ensuing detailed description when taken in conjunction with the accompanying drawings in which.

DETAILED DESCRIPTION OF THE PREFERRED EMBODIMENT

Figure 1:
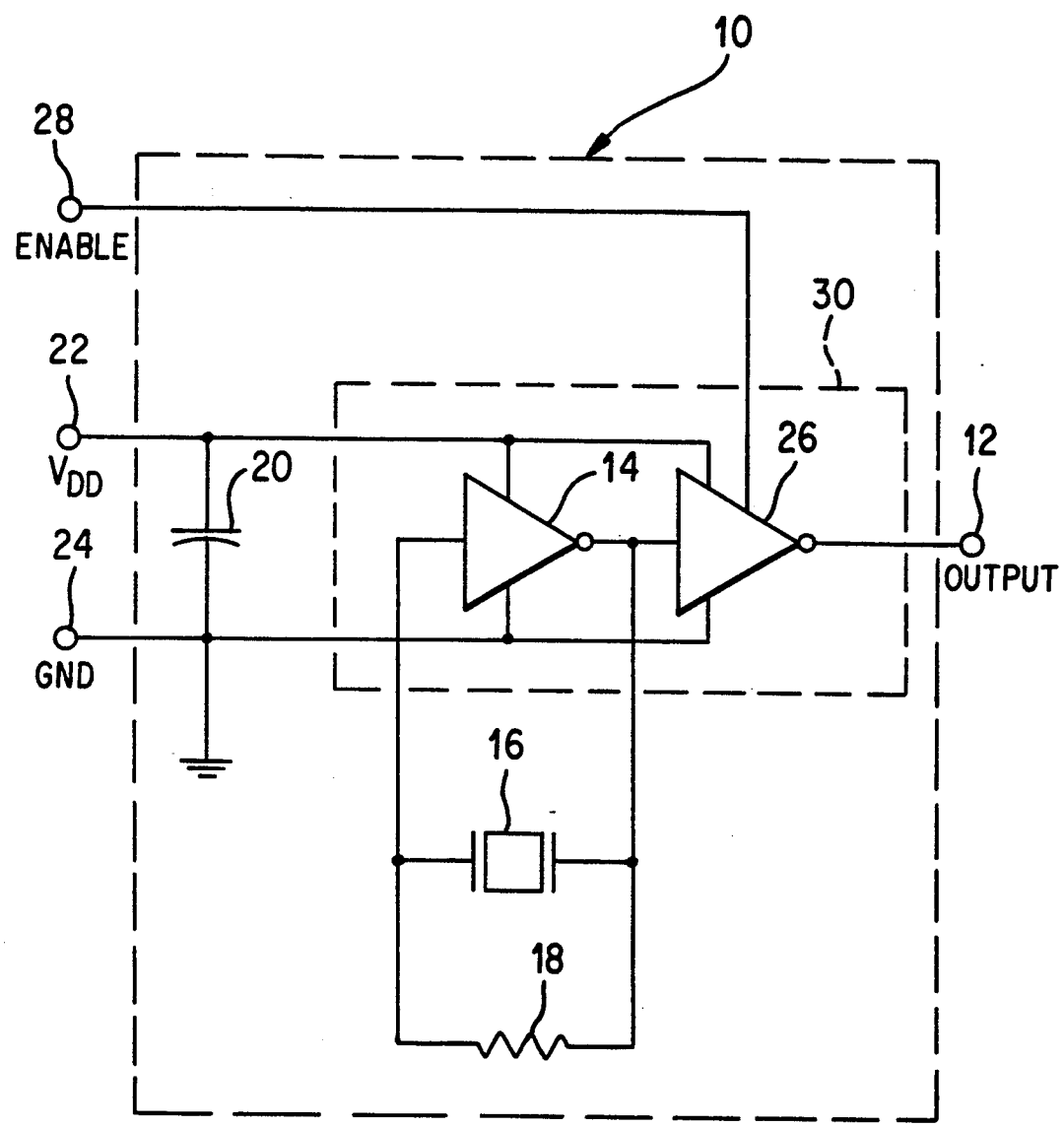
FIG. 1 is a schematic diagram of a crystal controlled clock oscillator circuit of the kind which may be used in the present invention.

FIG. 1 is a schematic diagram of a clock oscillator circuit 10 of the kind used to generate digital logic-level signals at an output pin or lead 12. The circuit 10 includes a CMOS inverter 14 shunted by feedback elements comprising a quartz crystal oscillator 16 and, optionally, a chip resistor 18. A power supply filter chip capacitor 20 is connected across supply and ground pins or leads 22 and 24, respectively. An output CMOS inverter 26 having a terminal for receiving an enable signal via an enable pin or lead 28 is coupled in series with the inverter 14. The inverters 14 and 26 are in the form of an integrated circuit device 30.

The fabrication of a clock oscillator SMD module incorporating the circuit shown in FIG. 1 will be described with reference to FIGS. 2 and 3. A series of clock oscillator modules are formed on a lead frame strip 40 which is cut or stamped from a flat sheet of suitable conductive material and chemically etched to define along the length of the strip a plurality (for example, fifteen) of consecutive, longitudinally spaced, identical lead frames, such as the lead frame 42. The strip 40 has perforated, longitudinal side bars 44 and transverse cross bars 46 supporting the lead frame 42 by means including tie bars 48. The lead frame 42 is designed to receive the clock oscillator circuit elements and the assembly so formed is ultimately encapsulated in resin by means of a transfer molding process. The final resin-encapsulated package has an outline shown in FIGS. 2 and 3 by the broken line 50. The package outline comprises longitudinally extending side edges or margins 52 and 54 and transversely extending end edges or margins 56 and 58. After molding, the side bars 44 and tie bars 48 are severed to form the individual modules.

Each lead frame 42 defines a rectangular clock oscillator-receiving opening 60 extending longitudinally between the end margins 56 and 58 of the lead frame; a pair of clock oscillator lead pads 62 adjacent the end margin 56; an IC die pad 64; a pair of capacitor pads 66; and a pair of resistor pads 68. The pads 64, 66 and 68 are all positioned on one side of the crystal opening 60, that is, between the opening 60 and the side margin 54 of the lead frame. The pads 64, 66 and 68 are interconnected consistent with the circuit schematic of FIG. 1 and coupled to the four leads 12, 22, 24 and 28 by conductors such as conductive traces 70–77. The leads 12 and 22 project from the side margin 52 of the lead frame while the leads 24 and 28 project from the side margin 54.

Figure 2:
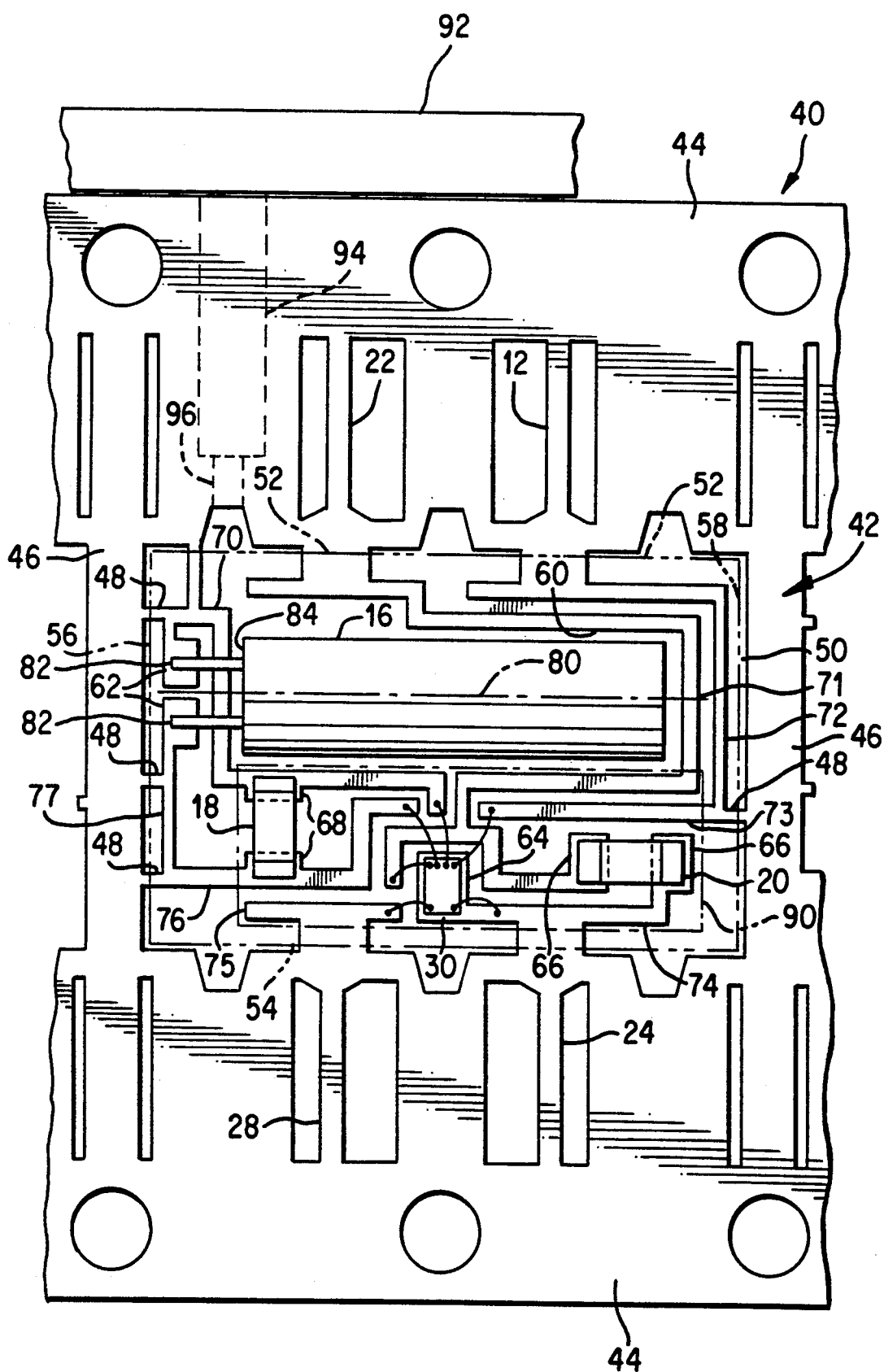
FIG. 2 is a plan view of a portion of a lead frame strip showing, in accordance with the invention, the configuration of a typical lead frame, the component placement on the lead frame, and the resin introduction position and direction.
Figure 3:
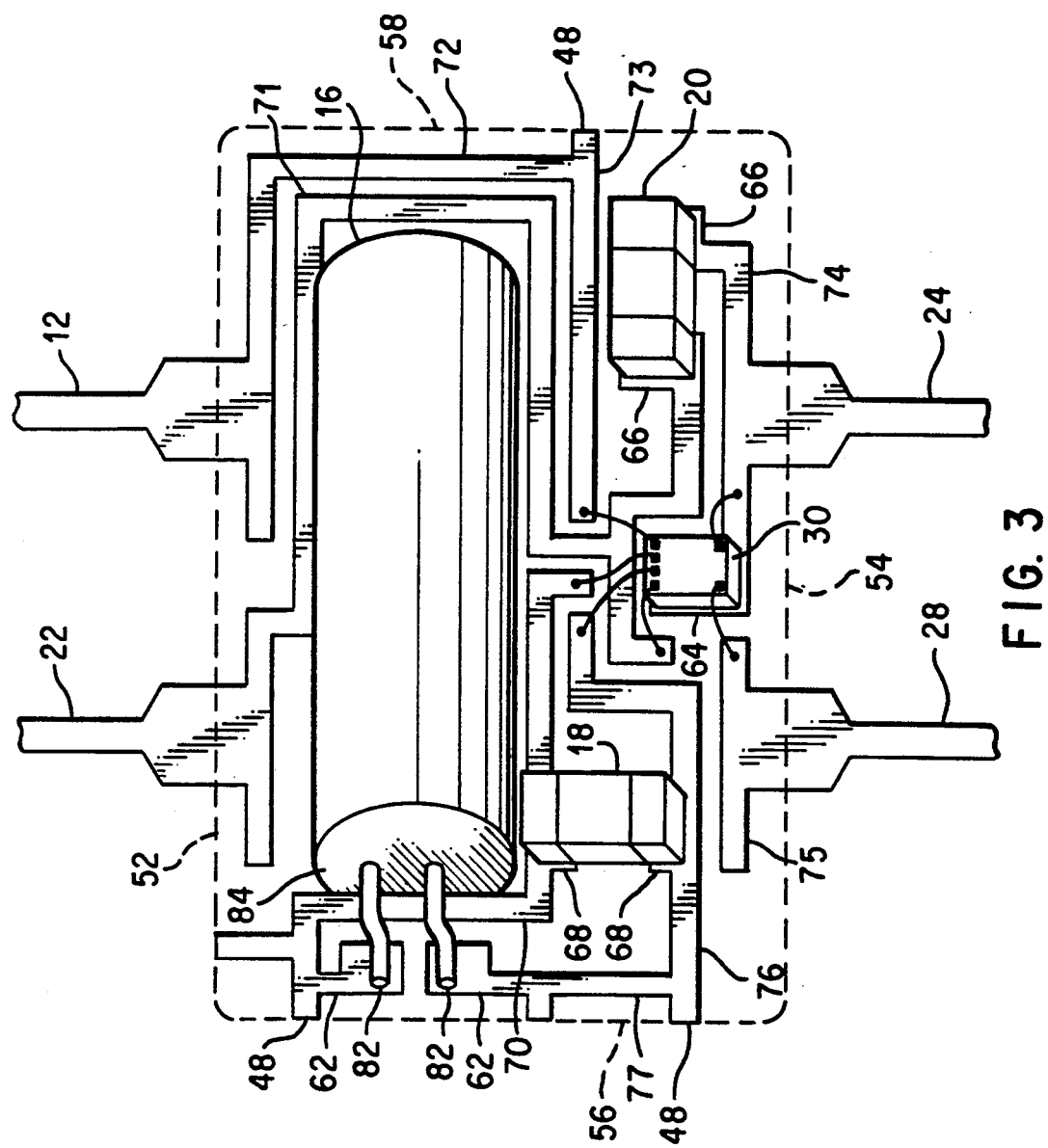
FIG. 3 is a plan view of a clock oscillator module in accordance with the invention showing details of the lead frame structure and components mounted thereon, with said components shown isometrically.

As shown in FIGS. 2 and 3, the crystal oscillator 16 is mounted within the rectangular opening 60 of the lead frame. The crystal oscillator 16 typically has a generally cylindrical shape with a central axis 80 extending longitudinally, that is, parallel with the side margins 52 and 54 of the lead frame 42. The crystal 16 further includes a pair of longitudinal leads 82 which project from an end surface 84 of the crystal package and which are welded to the pads 62. The crystal 16 is thus mounted in cantilever fashion from the lead frame pads 62. The remaining components, including the integrated circuit device 30, the chip capacitor 20 and the optional resistor 18 are attached to their respective pads 64, 66 and 68. These components, as seen in FIGS. 2 and 3, are disposed between the crystal oscillator 16 and the lead frame edge margin 54 to form a compact package which can be dimensioned to be compatible with SMD standards. Other advantages of such placement are pointed out below.

The area of the lead frame bounded by the broken line 90 (FIG. 2), which area includes the pads 64, 66 and 68, is plated with a precious metal such as silver. Silver epoxy applied to the pads is used to attach the IC, the capacitor and the optional feedback resistor to the lead frame.

After welding of the leads of the crystal 16 to the crystal oscillator pads 62, attachment of the capacitor, resistor and integrated circuit to their associate pads and wire bonding of the terminals of the integrated circuit to the appropriate conductive traces (FIG. 3), the lead frame strip is mounted in a transfer molding cavity plate assembly and the clock oscillator unit is resin encapsulated by means of a transfer molding process. As seen in FIG. 2, resin is fed into each mold cavity from a longitudinal feed runner channel 92, through a transversely extending channel 94 and a gate 96 extending therefrom. Importantly, the gate 96 is positioned along the side margin 52 of the lead frame adjacent the corner of the lead frame defined by the side and end margins 52 and 56. Thus, the gate 96 directs resin towards the fixed leads of the crystal, perpendicular to the direction of those leads and along the side of the lead frame opposite that adjacent to which the integrated circuit, capacitor and resistor are mounted. It has been found that by thus positioning the resin gate relative to the components and injecting the resin in the transverse direction shown, disturbance of the lead frame and the components mounted thereon resulting from the resin injection is virtually eliminated, and furthermore, the mold cavity defining the resin encapsulation for each module is completely filled in a reliable fashion. As a result, superior production yields are obtained utilizing the fabrication technique of the present invention with the encapsulated components of the final module being completely isolated from environmental effects.

Figure 4A:
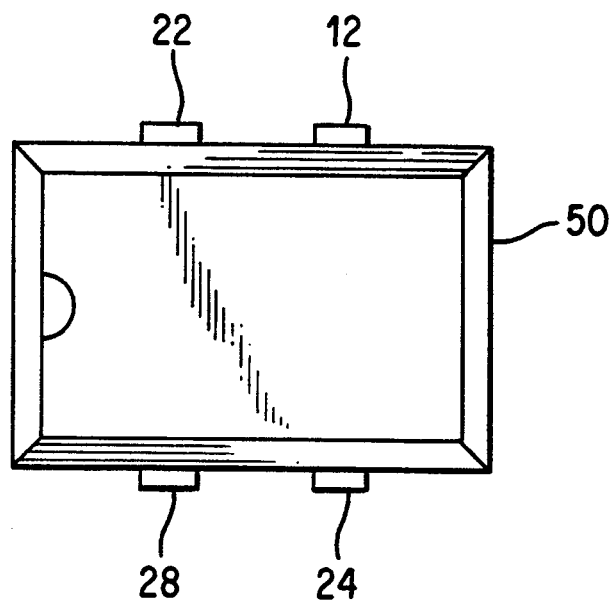
FIGS. 4A–4C are plan, side elevation and end elevation views of the final clock oscillator module fabricated in accordance with the invention.
Figure 4B:
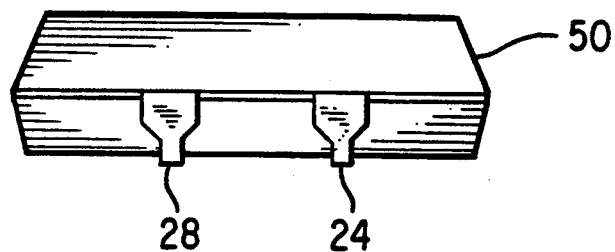
Figure 4C:
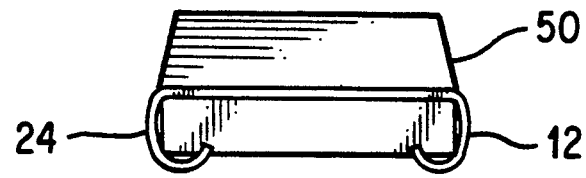

Following "singulation" of the modules, the leads 12, 22, 24 and 28 are bent into the J-lead configuration shown in FIGS. 4A–4C which depict the final SMD package configuration.

It will be understood by those skilled in the art that modifications may be made in the structures and methods set forth herein without departing from the spirit and scope of the invention as defined in the claims which follow, and it is intended that the structures and methods described above and shown in the accompanying drawings are to be construed as illustrative only.

What is claimed is:

1. A compact, surface mountable clock oscillator module comprising:

a lead frame having end edges, side edges perpendicular to the end edges and a pair of J-lead pins projecting from each of the side edges, the lead frame further defining an integrated circuit die pad, a pair of chip capacitor pads, a pair of crystal oscillator pads, conductors interconnecting said pins and pads, and an opening for receiving a crystal oscillator, the crystal oscillator pads being positioned proximate one of the end edges of the lead frame and the integrated circuit die pad and chip capacitor pads being positioned between the crystal oscillator opening and one of the side edges of the lead frame;

a generally cylindrical crystal oscillator disposed within said opening, the crystal oscillator having end surfaces and a central longitudinal axis extending generally parallel with the side edges of the lead frame, the crystal oscillator further including a pair of leads extending from one of the end surfaces of the crystal oscillator and connected to the crystal oscillator pads defined by the lead frame;

an integrated circuit mounted on the integrated circuit die pad and including terminals connected to selected lead frame conductors; and a chip capacitor mounted on the chip capacitor pads, all of the aforementioned elements except for the J-lead pins being contained within a unitary resin encapsulation.

2. A clock oscillator module, as defined in claim 1, in which:

the lead frame defines a pair of resistor pads positioned between the crystal oscillator opening and said one edge of said lead frame, the resistor pads being coupled across the crystal oscillator leads; and a resistor is mounted on the resistor pads, the resistor being contained within the resin encapsulation.

* * * * *